(12) United States Patent
Tsujikawa et al.

(10) Patent No.: US 6,777,296 B2
(45) Date of Patent: Aug. 17, 2004

(54) SEMICONDUCTOR DEVICE AND MANUFACTURING METHOD THEREOF

(75) Inventors: Shimpei Tsujikawa, Hino (JP); Toshiyuki Mine, Fusa (JP); Jiro Yugami, Yokohama (JP); Hirotaka Hamamura, Kunitachi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/321,501

(22) Filed: Dec. 18, 2002

(65) Prior Publication Data

US 2003/0171005 A1 Sep. 11, 2003

(30) Foreign Application Priority Data

Mar. 7, 2002  (JP) ........................................ 2002-061305

(51) Int. Cl.⁷ .................. H01L 21/336; H01L 21/8238; H01L 21/3205; H01L 21/31; H01L 21/469
(52) U.S. Cl. ........................ 438/287; 438/216; 438/261; 438/591; 438/301; 438/785
(58) Field of Search .............................. 438/287, 216, 438/261, 591, 302, 299, 303, 304, 385, 306, 307, 199

(56) References Cited

U.S. PATENT DOCUMENTS

| | | | | |
|---|---|---|---|---|
| H1287 H | * | 2/1994 | Zeisse et al. | 257/410 |
| 5,334,870 A | * | 8/1994 | Katada et al. | 257/371 |
| 5,753,556 A | * | 5/1998 | Katada et al. | 438/302 |
| 6,093,944 A | * | 7/2000 | VanDover | 257/310 |
| 6,251,720 B1 | * | 6/2001 | Thakur et al. | 438/240 |
| 6,316,304 B1 | * | 11/2001 | Pradeep et al. | 438/230 |

OTHER PUBLICATIONS

"MOSFET Devices with Polysilicon on Single–Layer $HfO_2$ High–K Dielectrics" L. Kang et al., IEDM 00–35, pp. 35–38.

"MOS Characteristics of Ultra Thin Rapid Thermal CVD $ZrO_2$ and Zr Silicate Gate Dielectrics" C.H. Lee et al., IEDM, pp. 27–30.

* cited by examiner

Primary Examiner—John F. Niebling
Assistant Examiner—Ron Pompey
(74) Attorney, Agent, or Firm—Antonelli, Terry, Stout & Kraus, LLP

(57) ABSTRACT

Disclosed is a method of improving smoothness on a surface of a gate dielectric composed of a high dielectric film made of metal oxide. A dielectric film with a high permittivity made of metal oxide such as a $TiO_2$ film or a $ZrO_2$ film having an amorphous structure is deposited over a silicon substrate by the plasma enhanced chemical vapor deposition method, and the film is used as a gate dielectric. Since the gate dielectric has good surface smoothness, simultaneous reductions of both the film thickness of a gate dielectric and the gate leakage current can be achieved. In addition, it is also possible to reduce the variation in the characteristics of the devices.

4 Claims, 10 Drawing Sheets

(12)  United States Patent

SEMICONDUCTOR DEVICE AND MANUFACTURING METHOD THEREOF

TECHNICAL FIELD OF THE INVENTION

The present invention relates to a semiconductor device and a manufacturing method thereof. More particularly, the present invention relates to a technique effectively applied to a semiconductor device in which a part of a gate dielectric of a MISFET (Metal Insulator Semiconductor Field Effect Transistor) is composed of a dielectric film of high permittivity.

BACKGROUND OF THE INVENTION

In a device where a thickness of a gate dielectric scaled by the ratio of its dielectric constant to that of silicon oxide (hereinafter, also referred to as equivalent oxide thickness (EOT)) is about 3 nm or larger, a silicon oxide ($SiO_2$) film has been consistently used as a material of a gate dielectric of a semiconductor device using a MIS transistor.

However, when the equivalent oxide thickness of a gate dielectric is reduced to less than 3 nm as a result of the advancement of the film thickness reduction of the gate dielectric with an aim to achieve higher device speed, the direct-tunneling current flowing through the gate dielectric is evidently observed. Consequently, the gate leakage current is increased to the extent that cannot be ignored in view of the power saving.

For the solution of the problem, various attempts to reduce the direct-tunneling current have been carried out, that is, a metal oxide material having a dielectric constant higher than that of silicon oxide is used as a gate dielectric so as to increase the physical thickness of the gate dielectric even though the equivalent oxide thickness is almost equal to that of silicon oxide. For example, various approaches have been taken such as that disclosed on page 27 of IEDM Technical Digest in 2000 by C. H. Lee et al., in which a $ZrO_2$ film is used, and that disclosed on page 35 of IEDM Technical Digest in 2000 by Laegu Kang et al., in which an $HfO_2$ film is used.

SUMMARY OF THE INVENTION

It is well known that, when using a high dielectric film made of metal oxide as a gate dielectric, to keep both the EOT and the gate leakage current low and to ensure an interfacial property are important objects to be achieved. In addition, when taking the mounting to a product into consideration, it is apparent that to ensure the smoothness on a surface of the gate dielectric is also an extremely important object for reducing the characteristic variation between the devices.

Since the gate dielectric is needed to have small charge trapping states at the interface with a silicon substrate, it is preferable to use the chemical vapor deposition method (CVD method) in which damages on the silicon substrate at the deposition of a film are small, more particularly, the thermal chemical vapor deposition method is preferable as a forming method of a gate dielectric made of metal oxide. However, according to the examinations made by the inventors of this application, since the $TiO_2$ film and the $ZrO_2$ film formed by the thermal CVD method are polycrystalline, the smoothness on the film surface is insufficient, and the $TiO_2$ film and the $ZrO_2$ film are not suitable for practical use.

An object of the present invention is to provide a technique capable of improving the smoothness on the surface of a gate dielectric made of metal oxide.

Another object of the present invention is to provide a technique capable of reducing the leakage current in the gate dielectric made of metal oxide.

Another object of the present invention is to provide a technique capable of improving the current drivability of a MISFET having the gate dielectric made of metal oxide.

Another object of the present invention is to provide a technique capable of reducing the characteristic variation in the MISFETs having the gate dielectric made of metal oxide.

The above and other objects and novel characteristics of the present invention will be apparent from the description and the accompanying drawings of this specification.

For solving the above-described problem about the smoothness on the surface of the gate dielectric made of metal oxide, it is considered effective to form a film having an amorphous structure at least at the time immediately after the deposition.

Also, it is well known that, since metal oxide films such as a $TiO_2$ film and a $ZrO_2$ film deposited by the CVD method have many oxygen vacancies therein and have poor insulation properties at the time immediately after the deposition, it is necessary to perform some kind of oxidation processes for alteration after the deposition of the films. Therefore, it is more preferable if the amorphous structure can be maintained even after the oxidation processes for alteration because it is possible to proceed to the next step of forming electrode without reducing the smoothness on the surface.

Furthermore, it is estimated that, if the gate dielectric maintains the amorphous structure even after the final step of the manufacturing process (wafer process) of the semiconductor device, it is possible to further improve the smoothness of the gate dielectric in a finished state. In this case, however, restrictions on the processes are increased, for example, the thermal budget applied in a process after forming the gate dielectric is restricted.

As specific means for realizing the surface smoothness of the gate dielectric made of metal oxide, the inventors use the plasma enhanced CVD method, in which damages on a silicon substrate are small, to form a $TiO_2$ film or a $ZrO_2$ film having an amorphous structure. In this manner, it is possible to realize the good smoothness on the surface of the gate dielectric.

DESCRIPTION OF THE PREFERRED EMBODIMENTS

Hereinafter, embodiments of the present invention will be described with reference to the accompanying drawings. Note that components having the same function are denoted by the same reference symbols throughout the drawings for describing the embodiments, and the repetitive description thereof is omitted.

(First Embodiment)

Figure 1:
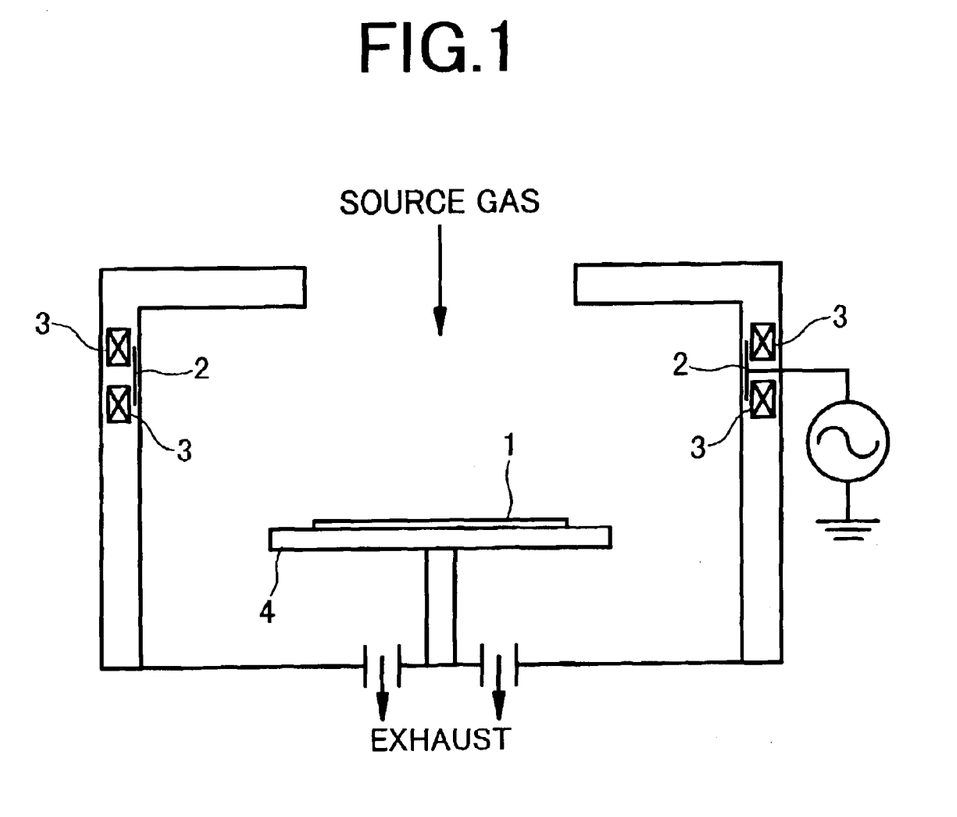
FIG. 1 is a schematic diagram of a plasma enhanced CVD apparatus used in the first embodiment of the present invention.

After removing the native oxide on the surface of a silicon wafer by soaking it in diluted HF, a $TiO_2$ film is deposited thereon by the plasma enhanced CVD method. The plasma enhanced CVD apparatus as shown in FIG. 1 is used in this embodiment, in which ring-shaped electrodes 2 and magnets 3 are provided near a silicon wafer 1, and source gas is introduced from an upper side and exhausted to the lower side while the silicon wafer 1 heated by a heater 4 is electrically grounded. As the source gas, gas obtained by vaporizing liquid tetraisopropoxy-titanium ($Ti(i-OC_3H_7)_4$) and oxygen is used. Two wafer temperatures of 300° C. and 375° C. are set as deposition conditions.

A conventional method in which a $TiO_2$ film is formed by the use of the same source gas as that described above by a normal CVD method not using plasma is taken as a comparative example. Two wafer temperatures of 300° C. and 400° C. are set as deposition conditions. In the case of the wafer temperature of 300° C., the deposition rate is very slow, that is, 0.1 nm per minute, and also, when the wafer temperature is reduced to lower than 300° C., the deposition rate is further decreased. More specifically, it can be said that the wafer temperature of 300° C. is the lowest possible temperature for the deposition of the $TiO_2$ film.

Figure 2:
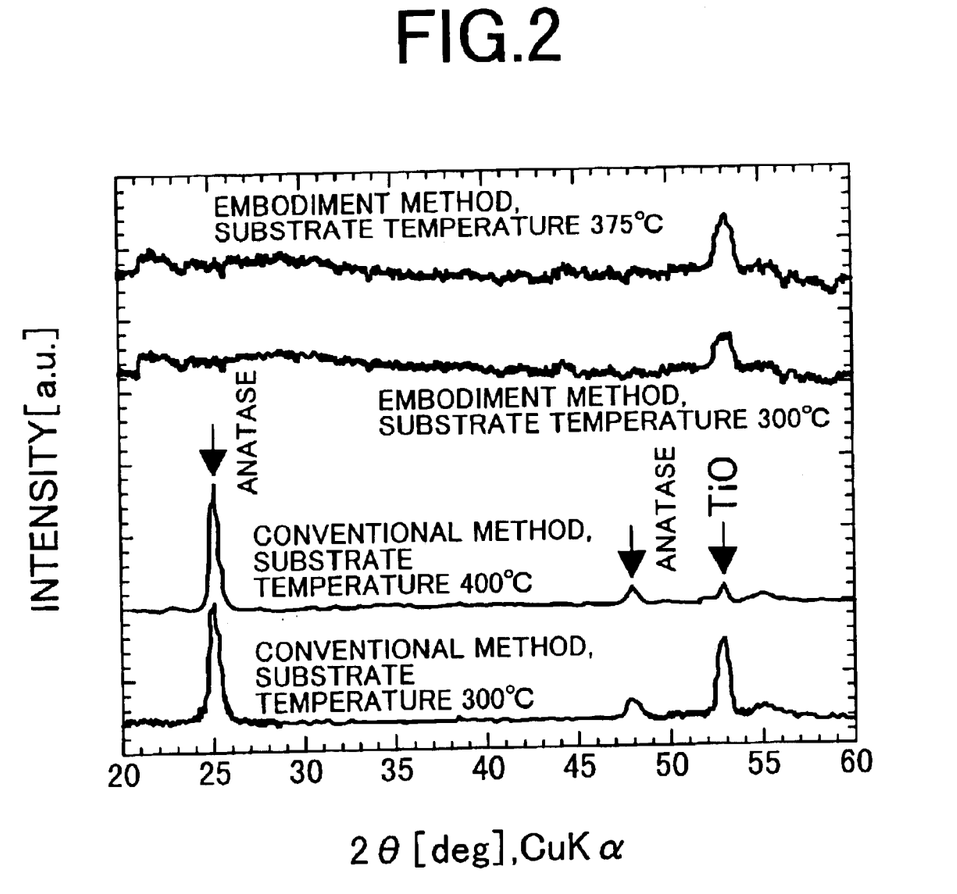
FIG. 2 shows graphs representing the results of thin film x-ray diffraction of $TiO_2$ films deposited under various deposition conditions.

The $TiO_2$ films with a thickness of 30 nm are deposited under the various conditions in accordance with the embodiment method and the conventional method, and the structures of the $TiO_2$ films are analyzed by thin film x-ray diffraction. The results are shown in FIG. 2.

A weak peak indicating the crystal phase of TiO exists on the graph of the plasma enhanced CVD-$TiO_2$ film deposited in accordance with the embodiment method. However, since the peak intensity is weak, it can be said that the film has an amorphous structure with very small particles of crystal. Hereinafter, a structure not showing a specific strong peak in the x-ray diffraction is called as amorphous. Meanwhile, the thermal CVD-$TiO_2$ films deposited in accordance with the conventional method show specific strong peak indicating the anatase phase in both the cases of the wafer temperature of 300° C. and 400° C., and it can be understood that the films are completely crystallized.

Next, the surface roughness of the same samples as those whose structures are analyzed by the thin film x-ray diffraction is measured by using the atomic force microscope (AFM). The roughness average (Ra) of the thermal CVD-$TiO_2$ film fabricated in accordance with the conventional method in the case of the wafer temperature of 400° C. is very large, that is, 12 nm, and 2.5 nm in the case of 300° C. Meanwhile, in the case of the plasma enhanced CVD-$TiO_2$ film fabricated in accordance with the embodiment method, no significant difference in the Ra is shown in both the cases of the wafer temperature of 300° C. and 375° C., and the Ra of the film can be reduced to about one-third of that of the conventional method, that is, about 0.8 nm. Judging from the results by the atomic force microscope and the thin film x-ray diffraction together, it can be understood that the embodiment method for forming the $TiO_2$ film with an amorphous structure is effective to reduce the surface roughness.

Also, the same effect can be observed with respect to the formation of a $ZrO_2$ film. The $ZrO_2$ film can be deposited by the CVD method using source gas obtained by vaporizing tetratertiary butoxy-zirconium ($Zr(t-OC_4H_9)_4$). However, since the $ZrO_2$ films obtained by using the thermal CVD method inevitably have a crystal structure, it is impossible to realize the smooth surface, and the Ra thereof is about 2.5 nm or larger. More specifically, the $ZrO_2$ film is identical to the $TiO_2$ film in the respect that the plasma enhanced CVD method is necessary to realize the amorphous structure having a smooth surface.

Since the $TiO_2$ films formed in accordance with the embodiment method and the conventional method have very large leakage current at the time immediately after the deposition, the $TiO_2$ film is altered so as to reduce the leakage current by the annealing at 600° C. and 800° C. in an atmosphere of 5% oxygen diluted with nitrogen. Thereafter, a gold (Au) electrode is evaporated on the film. In this state, the electric capacitance is measured. The plasma enhanced CVD-$TiO_2$ film in accordance with the embodiment method is deposited under the condition of the wafer temperature of 375° C., and the thermal CVD-$TiO_2$ film in accordance with the conventional method is deposited under the condition of the wafer temperature of 300° C. By plotting the equivalent oxide thickness obtained based on the electric capacitance on the thickness of the deposited film, the dielectric constant of the film can be obtained.

In addition, it is well known that the alteration of a metal oxide film such as the $TiO_2$ film in the oxygen atmosphere causes the growth of an $SiO_2$ layer at the interface between the metal oxide film and the silicon substrate, and the $SiO_2$ layer interferes the reduction of the equivalent oxide thickness. It is also possible to obtain the growth thickness of the interfacial $SiO_2$ layer by the same plotting as that described above.

Figure 3A:
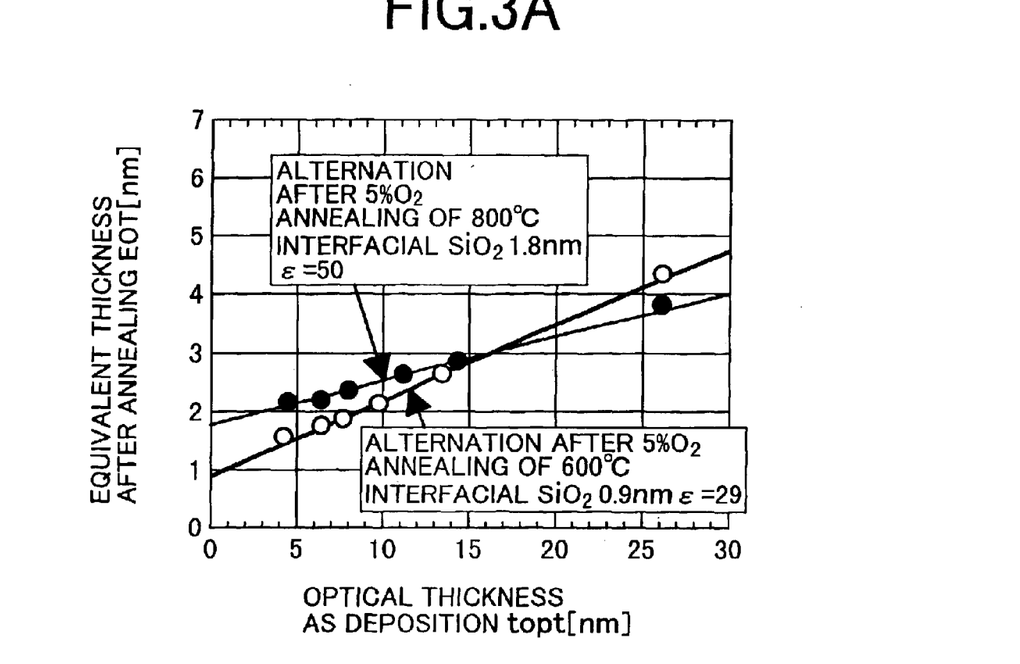
FIG. 3A shows graphs representing the relationship between the thickness of the $TiO_2$ film deposited in accordance with the embodiment method and the equivalent oxide thickness after the annealing of the same and FIG. 3B shows graphs representing the relationship between the thickness of the $TiO_2$ film deposited in accordance with the conventional method and the equivalent oxide thickness after the annealing of the same.
Figure 3B:
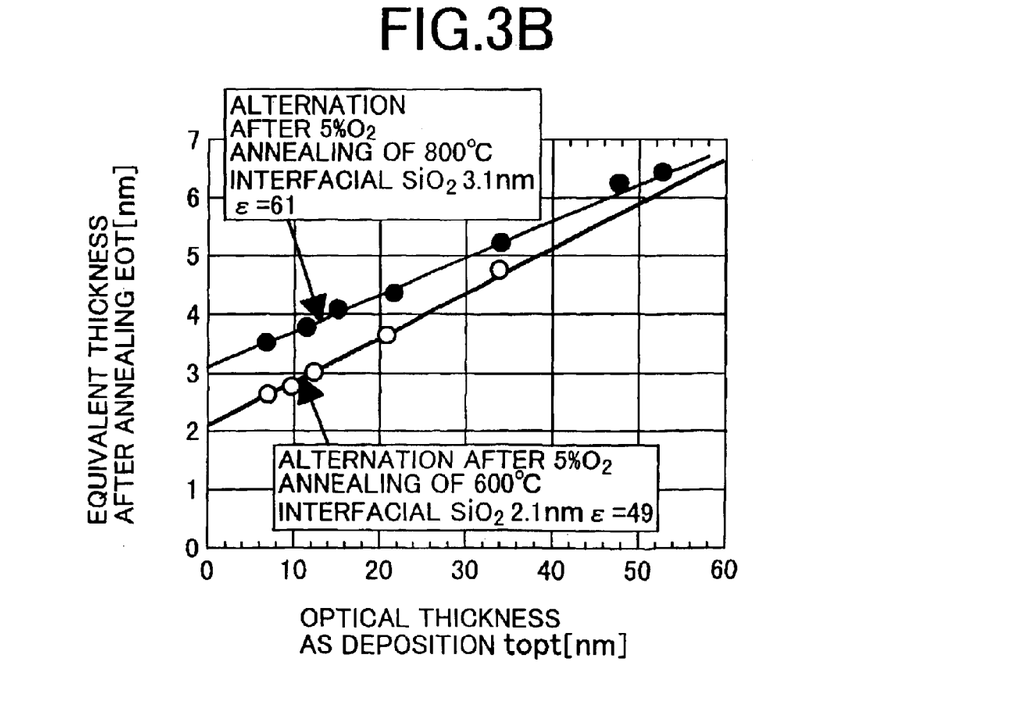

The result of the plotting of the equivalent oxide thickness on the deposition thickness in the case of the $TiO_2$ film formed in accordance with the embodiment method is shown in FIG. 3A. Also, the result of the same plotting in the case of the $TiO_2$ film formed in accordance with the conventional method is shown in FIG. 3B.

When the $TiO_2$ film is formed in accordance with the embodiment method, the dielectric constant is 29 and the growth thickness of the interfacial $SiO_2$ layer is 0.9 nm in the case of the alteration oxygen annealing at 600° C. Also, the dielectric constant is 50 and the growth thickness of the interfacial $SiO_2$ layer is 1.8 nm in the case of the alteration oxygen annealing at 800° C. Meanwhile, when the $TiO_2$ film is formed in accordance with the conventional method, the dielectric constant is 49 and the growth thickness of the interfacial $SiO_2$ layer is 2.1 nm in the case of the alteration oxygen annealing at 600° C. Also, the dielectric constant is 61 and the growth thickness of the interfacial $SiO_2$ layer is 3.1 nm in the case of the alteration oxygen annealing at 800° C.

Figure 4:
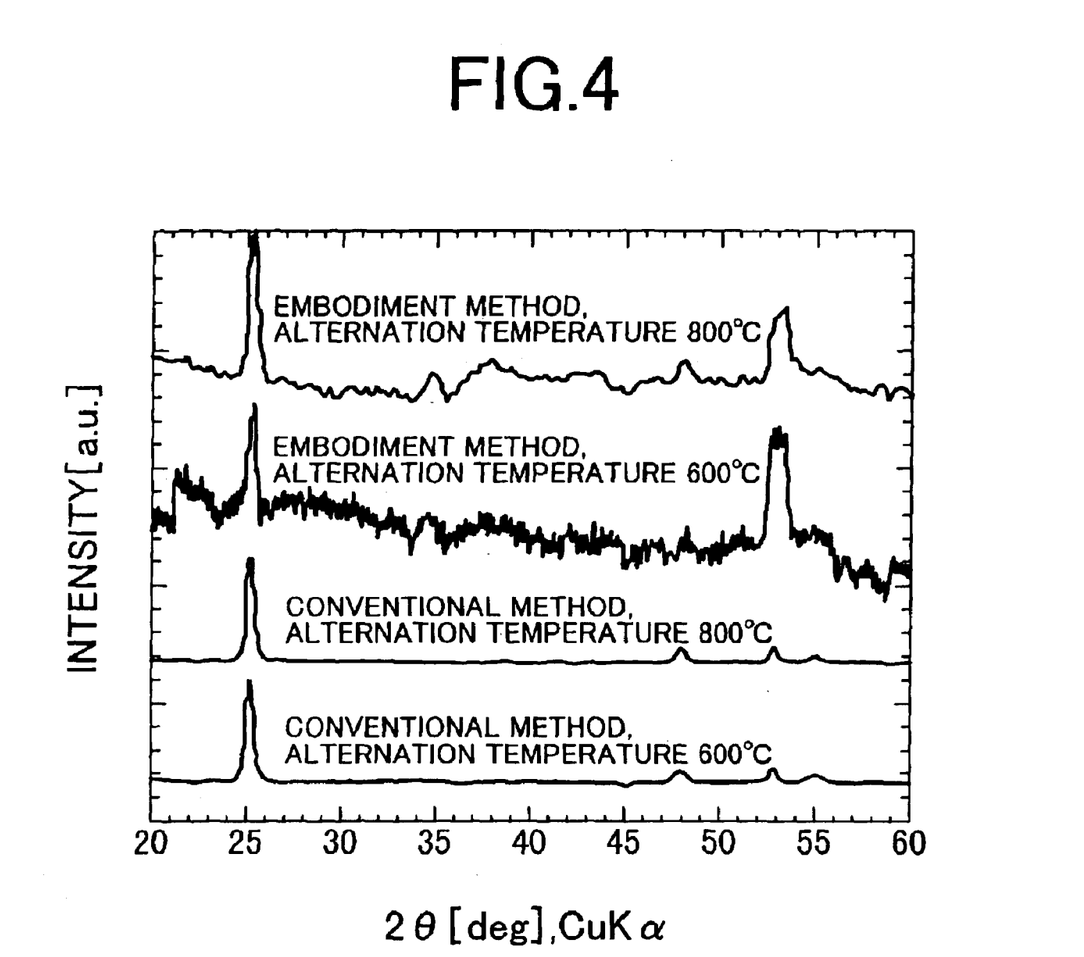
FIG. 4 shows graphs representing the results of the measurement by the thin film x-ray diffraction for the structure of the $TiO_2$ films altered in various annealing temperatures.

FIG. 4 shows the results of the thin film x-ray diffraction of the annealed $TiO_2$ films of these samples performed in order to examine the structure change due to the alteration annealing. Although weak peaks of anatase phase are generated when performing the annealing at 600° C. in the case of the $TiO_2$ film formed in accordance with the embodiment method, the intensity of the peaks is weak. Therefore, the phase in which the amorphous phase and very small particles of crystal are mixed is formed. In the case of the annealing at 800° C., although stronger peaks of anatase phase are also generated, the intensity of the peaks is also weak. Therefore, it is recognized that the crystallization is incomplete. Meanwhile, in the case of the $TiO_2$ film formed in accordance with the conventional method, sharp peaks of the anatase phase like those at the time immediately after the deposition are found in both cases of the annealing at 600° C. and 800° C. Therefore, it is recognized that the crystal structure is formed.

Figure 5:
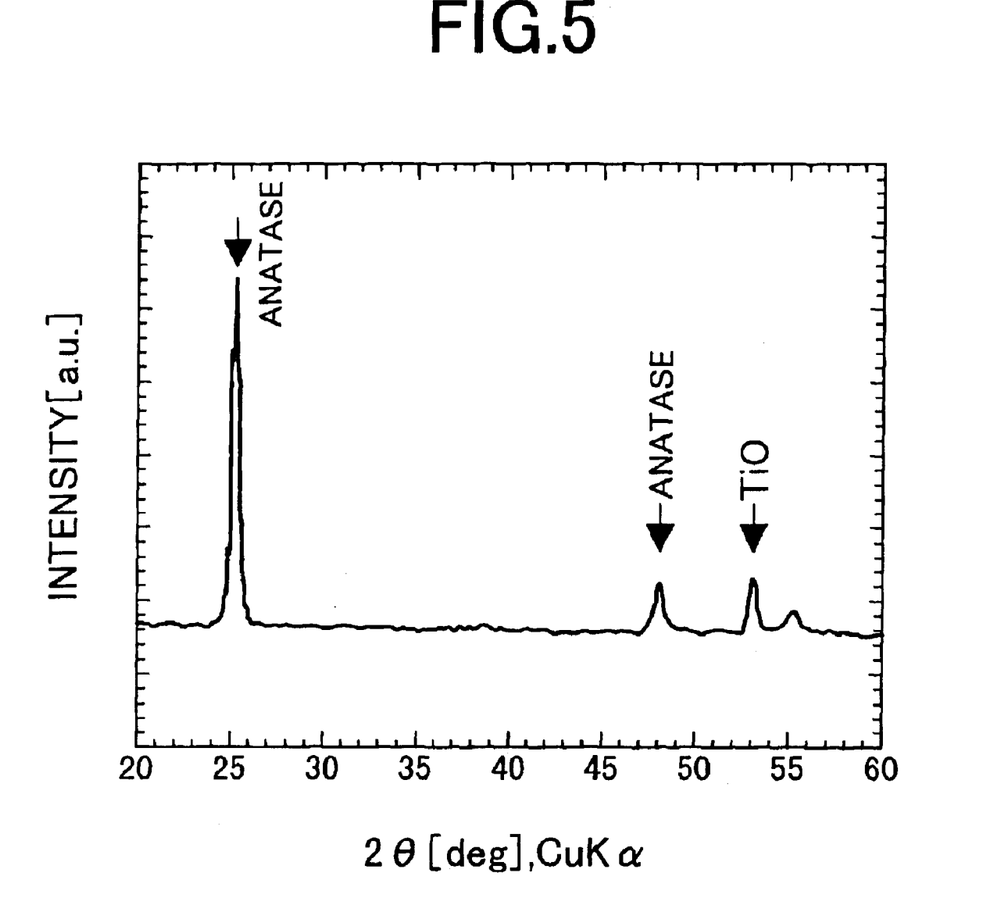
FIG. 5 shows a graph representing the result of the measurement by the thin film x-ray diffraction for the structure of the $TiO_2$ film altered in an annealing temperature of 900° C.

Next, in order to examine the thermal stability of the $TiO_2$ film formed in accordance with the embodiment method, the structure of the film after the annealing at 900° C. in an oxygen atmosphere is analyzed by means of the thin film x-ray diffraction. FIG. 5 shows the result of the analysis, in which sharp peaks of anatase phase are recognized. According to this result, it can be said that the film is completely crystallized in the case of the annealing at 900° C.

From the foregoing description, it can be understood that the dielectric constant of the $TiO_2$ films fabricated in accordance with the embodiment method and the conventional method have a certain range regardless of the amorphous and crystal structure. It is thought that this is because the film thickness is small and the composition is not stoichiometric composition. In addition, the thickness of the $SiO_2$ layer formed at the interface is smaller in the case where the amorphous $TiO_2$ film is formed in accordance with the embodiment method and then the $TiO_2$ film is altered by the oxygen annealing. It is thought that this is because oxygen diffuses rapidly through the grain boundary in the crystal structure and a large amount of oxygen is supplied to the interface between the $TiO_2$ film and the silicon substrate, and thus, the $SiO_2$ layer is grown at high rate.

As described above, by depositing a $TiO_2$ film with an amorphous structure in accordance with the embodiment method and then altering the film, a dielectric film with a smooth surface in which an $SiO_2$ layer formed at the interface with a silicon substrate is not so thick even after the alteration annealing can be obtained. More specifically, a dielectric film having a small equivalent oxide thickness can be obtained.

(Second Embodiment)

Next, an embodiment will be described in which a gate dielectric of an n-channel MISFET formed over a silicon substrate is composed of a high dielectric film made of metal oxide.

Figure 6:
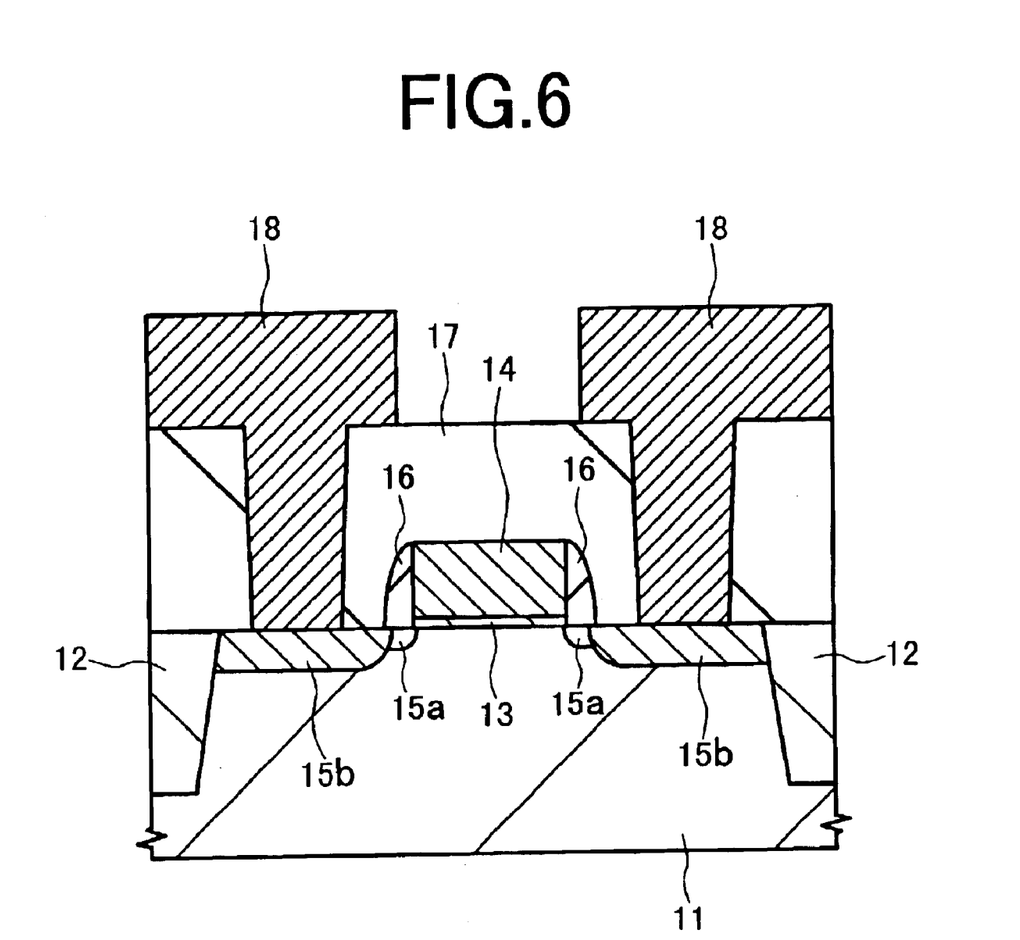
FIG. 6 is a sectional view showing a structure of an n-channel MISFET formed on a silicon substrate.

FIG. 6 is a sectional view showing a structure of an n-channel MISFET formed over a silicon substrate. The n-channel MISFET is formed in the following manner. First, device isolation trenches 12 are formed in accordance with the known shallow trench isolation method in a surface of a silicon substrate 11 made of p-type single crystal.

Subsequently, a $TiO_2$ film is deposited over the silicon substrate 11 in the same manner as that in the first embodiment (embodiment method). Also, as a comparative example, a $TiO_2$ film is deposited in accordance with the conventional method described in the first embodiment. Note that a $TiO_2$ film with a thickness of 13.5 nm is deposited under the condition of the substrate temperature of 375° C. in the embodiment method, and a $TiO_2$ film with a thickness of 7 nm is deposited under the condition of the substrate temperature of 300° C. in the conventional method.

Subsequently, these $TiO_2$ films are altered by the annealing at 600° C. in an atmosphere of 5% oxygen diluted with nitrogen to form a gate dielectric 13. Thereafter, a gate electrode 14 is formed on the gate dielectric 13. The gate electrode 14 is formed in the following manner. First, a TiN film with a thickness of 10 nm is deposited over the gate dielectric 13 by the known chemical vapor deposition method using vaporized $TiCl_4$ and $NH_3$ as source gas, and then, a W film with a thickness of 200 nm is deposited over the TiN film by the sputtering method. Thereafter, these films are patterned by the dry-etching using a photo-resist film as a mask.

Next, the gate dielectric 13 on both sides of the gate electrode 14 are etched and removed. Subsequently, the annealing of the silicon substrate 11 in the oxygen atmosphere at 700° C. is performed. Thereafter, arsenic (As) ions are implanted into the silicon substrate 11, thereby forming a low impurity concentration $n^-$-type semiconductor regions 15a. Subsequently, a silicon oxide film with a thickness of 100 nm is deposited over the silicon substrate 11 by the chemical vapor deposition method using $SiH_4$ and $N_2O$ as source gas, and then, sidewall spacers 16 are formed on the sidewalls of the gate electrode 14 by performing the anisotropic dry etching to the silicon oxide film.

Next, phosphorus (P) ions are implanted into the silicon substrate 11 and the silicon substrate 11 is annealed in a nitrogen atmosphere to electrically activate the impurities (phosphorus). By doing so, a high impurity concentration $n^+$-type semiconductor regions (source and drain) 15b are formed. This annealing is preferably performed under the conditions of 950° C. and 30 seconds so as to promote the activation of the impurity. However, the temperature in the conditions is so high that the gate dielectric 13 composed of the $TiO_2$ film with an amorphous structure formed in accordance with the embodiment method is crystallized. For the prevention of the crystallization of the $TiO_2$ film, the annealing under the conditions of 800° C. and 1 minute is suitable. However, the annealing under such conditions causes the problem of the increase of the resistance in the n-type semiconductor regions 15a and 15b. In this embodiment, the annealing under the conditions of 800° C. and 1 minute and that under the conditions of 950° C. and 30 minutes are performed.

Next, a silicon oxide film is deposited over the silicon substrate 11 by the chemical vapor deposition method using $SiH_4$ and $N_2O$ as source gas, and then, the surface of the silicon oxide is planarized by the chemical mechanical polishing (CMP) method, thereby forming an interlayer dielectric 17 over the gate electrode 14.

Next, the interlayer dielectric 17 is partially dry-etched with using a photo-resist film as a mask, thereby forming contact holes on the $n^+$-type semiconductor regions (source and drain) 15b. Subsequently, a W film is deposited in the contact holes and on the interlayer dielectric 17 by the chemical vapor deposition method and the sputtering method, and then, the W film is partially dry-etched with using a photo-resist film as a mask. In this manner, a wiring 18 is formed.

The n-channel MISFET having a structure shown in FIG. 6 is completed by the processes described above. The equivalent oxide film thickness of the gate dielectric 13 obtained based on the capacitance measurement of the MISFET is 2.6 nm in the sample fabricated in accordance with the embodiment method and 2.7 nm in the sample fabricated in accordance with the conventional method.

Figure 7:
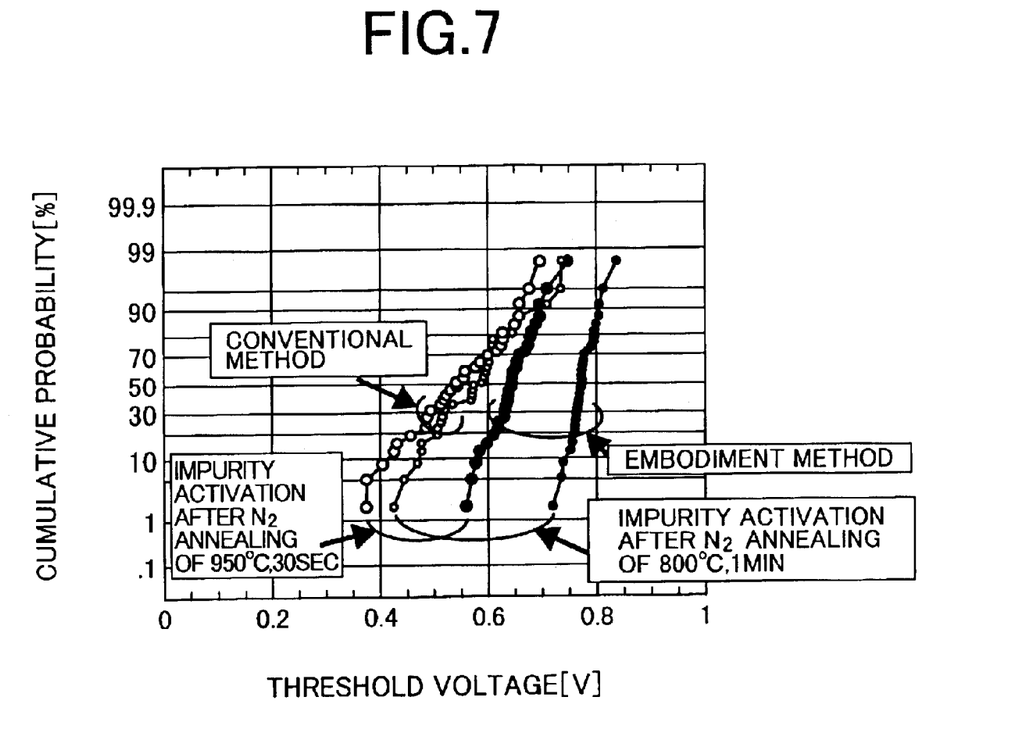
FIG. 7 shows graphs representing the results of the examination for the distribution of a plurality of threshold voltages of the MISFET having a gate length of 1 μm and a gate width of 10 μm measured on the same silicon substrate.

FIG. 7 shows the results of the examination for the distribution of a plurality of threshold voltages of the MISFET having a gate length of 1 μm and a gate width of 10 μm measured on the same silicon substrate. In the case where the above-described activation of the impurity is performed under the conditions of 800° C. and 1 minute, the standard deviation of the threshold voltages of the MISFET fabricated in accordance with the conventional method is 79 mV. Meanwhile, the standard deviation of the threshold voltages of the MISFET fabricated in accordance with the embodiment method is 25 mV. More specifically, the standard deviation can be reduced to less than one-third. In addition, in the case where the activation of the impurity is performed under the conditions of 950° C. and 30 seconds, the standard deviation of the threshold voltages of the MISFET fabricated in accordance with the conventional method is 89 mV. Meanwhile, the standard deviation of the threshold voltages of the MISFET fabricated in accordance with the embodiment method is 40 mV. More specifically, the standard deviation can be reduced to less than half.

From the foregoing description, it can be understood that the use of the embodiment method makes it possible to reduce the variation in the threshold voltages. Significant advantages can be achieved in both the case where the activation of impurity is performed at 800° C. so that the $TiO_2$ film formed in accordance with the embodiment method can maintain the amorphous structure even after the finish of all processes and the case where the activation of impurity is performed at 950° C. so as to transform the $TiO_2$ film formed in accordance with the embodiment method into the crystal structure. It is thought that this is because, if the $TiO_2$ film has an amorphous structure at the time of the deposition, the surface smoothness of the $TiO_2$ film is better in comparison to that having a crystal structure immediately after the deposition even if the $TiO_2$ film is crystallized in the later process. However, greater advantages can be obtained in the case where the amorphous structure is maintained in the $TiO_2$ film fabricated in accordance with the embodiment method.

(Third Embodiment)

In this embodiment, an n-channel MISFET having a gate dielectric composed of a high dielectric film on a silicon substrate is formed by the use of the manufacturing process in which a gate dielectric is formed after forming a source and a drain with an aim to reduce the thermal budget applied to the gate dielectric.

Figure 8:
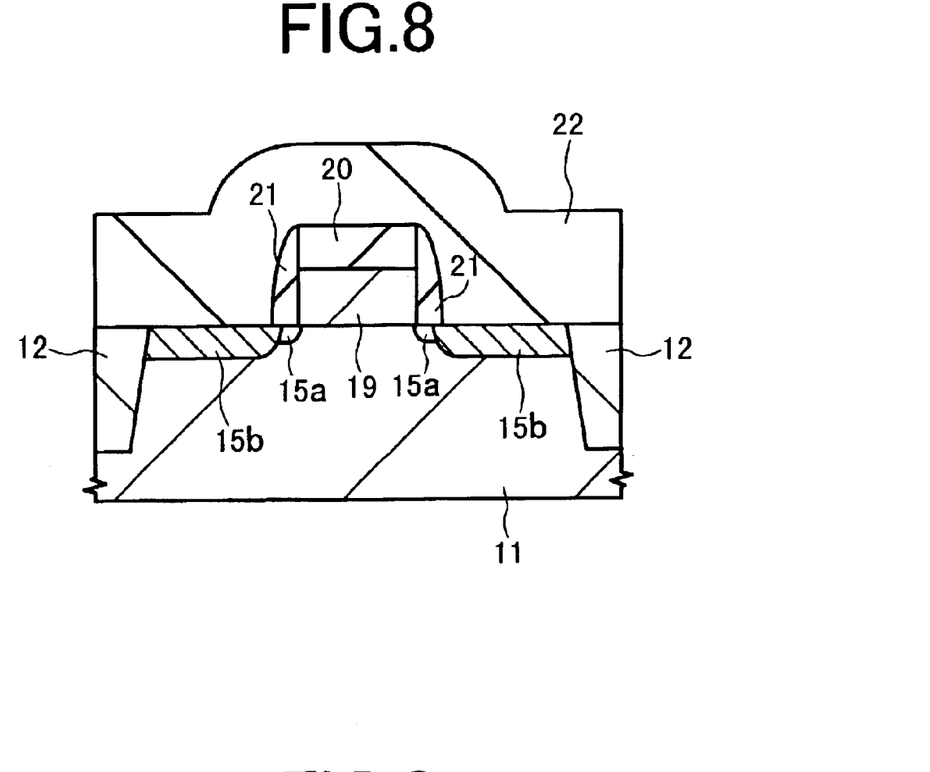
FIG. 8 is a sectional view showing the principal part of a silicon substrate, which illustrates the method of manufacturing a MISFET according to another embodiment of the present invention.

First, as shown in FIG. 8, device isolation trenches 12 are formed in accordance with the known shallow trench isolation method in the surface of a silicon substrate 11 made of p-type single crystal. Then, after the silicon substrate 11 is heated in an oxygen atmosphere at 800° C., a poly-silicon film 19 with a thickness of 150 nm and a silicon nitride ($Si_3N_4$) film with a thickness of 150 nm are deposited over the silicon substrate 11 by the chemical vapor deposition method. Subsequently, the poly-silicon film 19 and the silicon nitride film 20 are patterned by the photolithography or the electron beam patterning and the dry-etching. By doing so, the poly-silicon film 19 and the silicon nitride film 20 are left in the gate electrode forming region. The poly-silicon film 19 and the silicon nitride film 20 left in the gate electrode forming region are used as a dummy gate.

Next, after heating the silicon substrate 11 in an oxygen atmosphere at 800° C., arsenic (As) ions are implanted into the silicon substrate 11 under the conditions that the acceleration energy is 15 kV and the dose amount is $2 \times 10^{14}$ cm$^{-2}$, thereby forming a low impurity concentration n$^-$-type semiconductor regions 15a. Next, a silicon nitride film with a thickness of 100 nm is deposited over the silicon substrate 11 by the chemical vapor deposition method, and then, sidewall spacers 21 are formed on the sidewalls of the gate electrode 14 by performing the anisotropic dry etching to the silicon nitride film.

Next, phosphorus (P) ions are implanted into the silicon substrate 11 under the conditions that the acceleration energy is 45 kV and the dose amount is $3 \times 10^{15}$ cm$^{-2}$, and then, the annealing of the silicon substrate 11 in a nitrogen atmosphere at 1000° C. is performed to electrically activate the impurity (phosphorus), thereby forming the high impurity concentration n$^+$-type semiconductor regions (source and drain) 15b.

Next, a silicon oxide film 22 with a thickness of 300 nm is deposited over the silicon substrate 11 by the chemical vapor deposition method using tetraethoxysilane (TEOS) as source gas.

Figure 9:
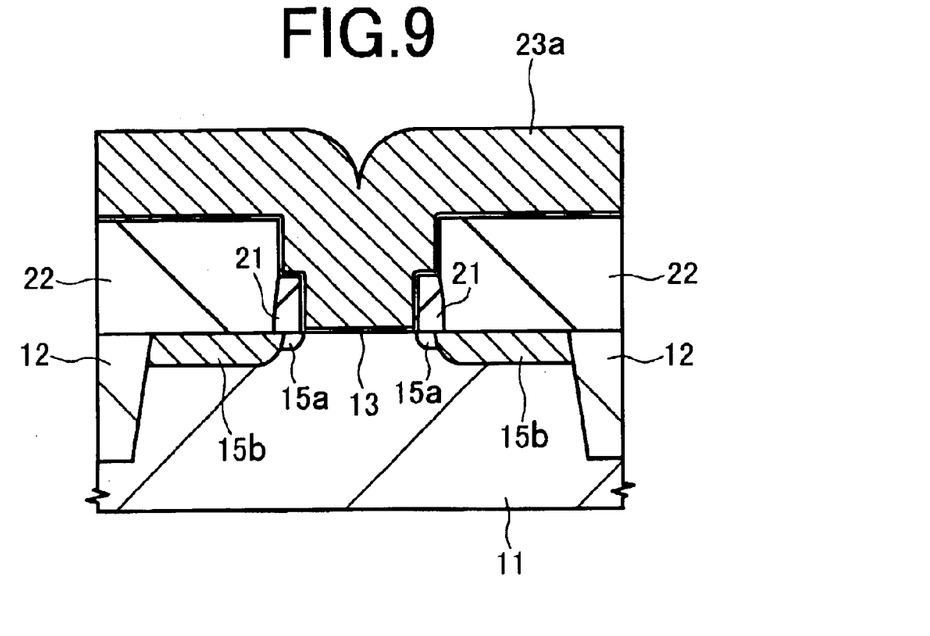
FIG. 9 is a sectional view showing the principal part of a silicon substrate, which illustrates the method of manufacturing a MISFET according to another embodiment of the present invention.

Next, as shown in FIG. 9, the surface of the silicon oxide film 22 is planarized by the chemical vapor deposition (CMP) method until the silicon nitride film 20 is exposed. Subsequently, parts of the sidewall spacers 21 and the silicon nitride film 20 are removed by the wet etching by the use of hot phosphoric acid, and then, the poly-silicon film 19 is removed by the chemical dry-etching. Thereafter, the surface of the silicon substrate 11 in the gate electrode forming region is exposed by the cleaning by the use of hydrofluoric acid.

Next, a $TiO_2$ film is deposited over the silicon substrate 11 in the same manner as that in the first embodiment (embodiment method), thereby forming the gate dielectric 13. Also, as a comparative example, a $TiO_2$ film is deposited in accordance with the conventional method described in the first embodiment.

Next, a TiN film with a thickness of 10 nm is deposited over the gate dielectric 13 by the known chemical vapor deposition method using vaporized $TiCl_4$ and $NH_3$ as source gas, and then, a W film with a thickness of 200 nm is deposited over the TiN film by the sputtering method, thereby forming a conductive film 23 used for the gate electrode. Note that it is also possible to use a poly-silicon film, a TaN film, a laminated film of a TaN film (upper layer)/a poly-silicon film (lower layer), and a laminated film of a W film (upper layer)/a TiN film (lower layer) as the conductive film 23 instead of the laminated film of the TiN film and the W film.

Figure 10:
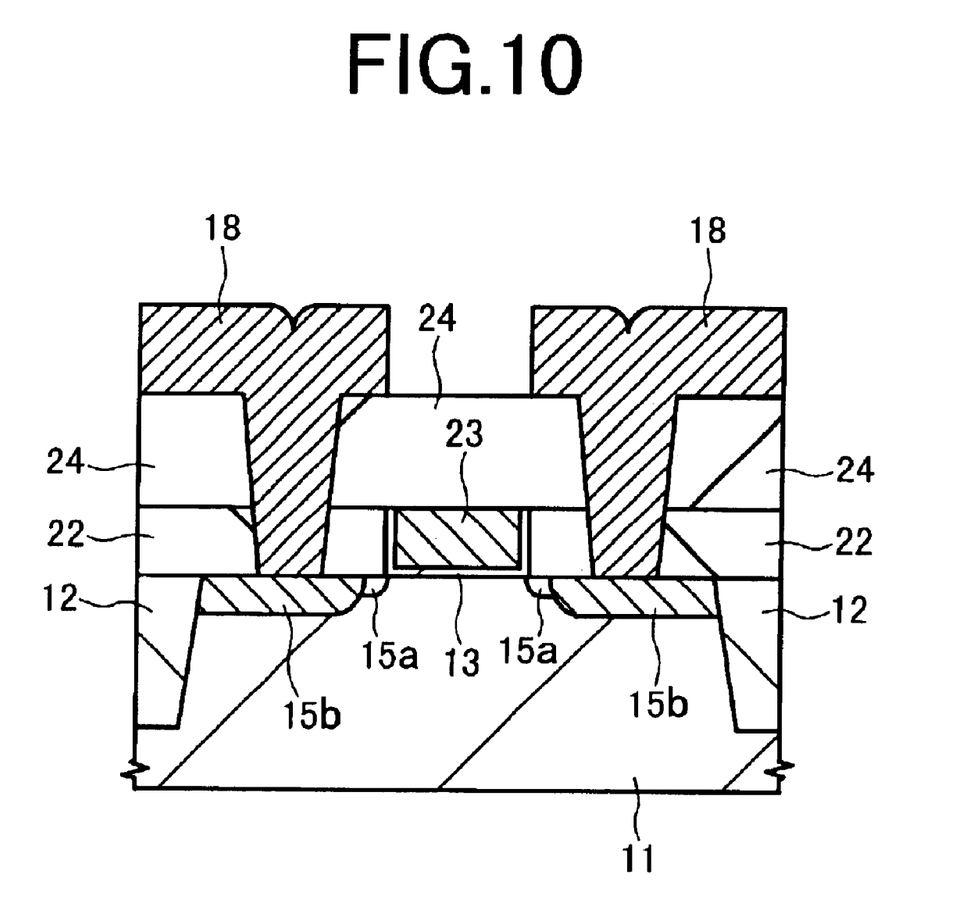
FIG. 10 is a sectional view showing the principal part of a silicon substrate, which illustrates the method of manufacturing a MISFET according to another embodiment of the present invention.

Next, as shown in FIG. 10, each part of the conductive film 23a, the silicon oxide film 22 and the gate dielectric 13 is polished with using the sidewall spacers 21 left on the silicon substrate 11 as a stopper. Thereafter, some parts of the gate dielectric 13 and the sidewall spacers 21 are removed by the chemical dry-etching, thereby forming a gate electrode 23.

Next, a silicon oxide film 24 with a thickness of 300 nm is deposited over the silicon substrate 11 by the chemical vapor deposition method using tetraethoxysilane (TEOS) as source gas, and then, contact holes are formed on the n⁺-type semiconductor regions (source and drain) 15*b* by performing the dry etching to each part of the silicon oxide films 22 and 24. Subsequently, a W film is deposited over the silicon oxide film 24 and in the contact holes by the use of the chemical vapor deposition method and the sputtering method, and then, the dry-etching is performed to a part of the W film with using a photo-resist film as a mask, thereby forming the wiring 18. The n-channel MISFET is completed by the processes described above.

Figure 11:
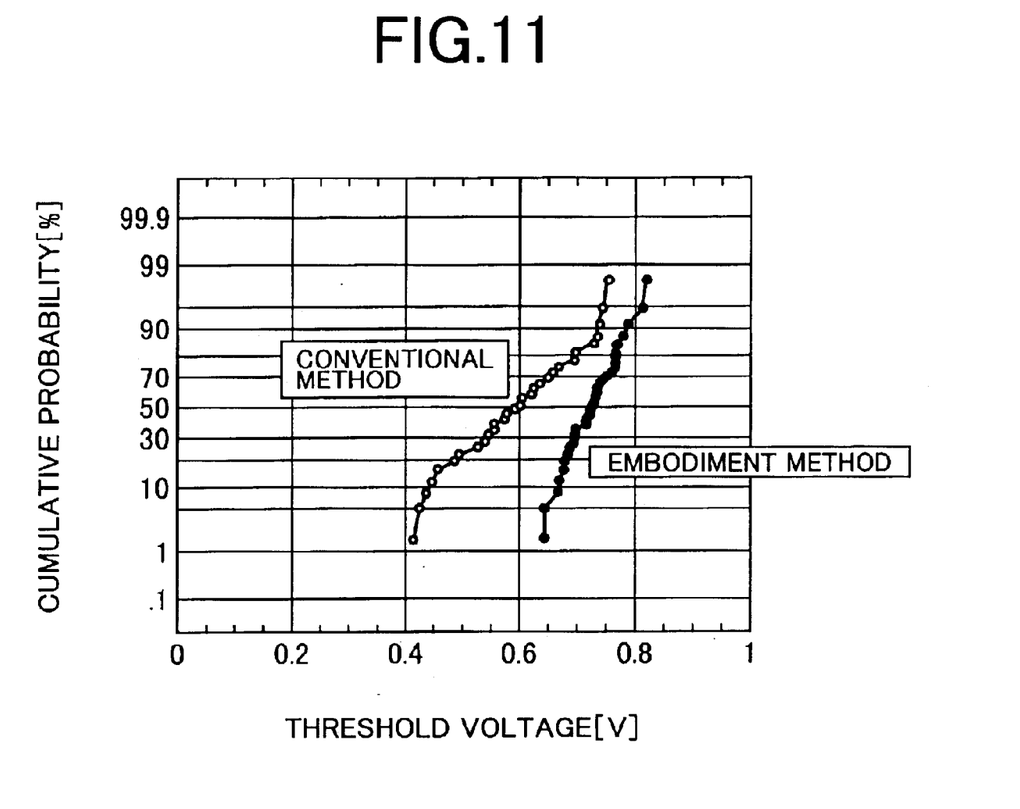
FIG. 11 is shows graphs representing the results of the examination for the distribution of a plurality of threshold voltages of the MISFET having a gate length of 1 μm and a gate width of 10 μm measured on the same silicon substrate.

FIG. 11 shows the results of the examination for the distribution of a plurality of threshold voltages of the MISFET having a gate length of 1 $\mu$m and a gate width of 10 $\mu$m measured on the same silicon substrate. The standard deviation of the threshold voltages of the MISFET fabricated in accordance with the conventional method is 102 mV. Meanwhile, the standard deviation of the threshold voltages of the MISFET fabricated in accordance with the embodiment method is 46 mV. More specifically, the standard deviation can be reduced to less than half. From the foregoing description, it can be understood that the use of the embodiment method for forming the gate dielectric 13 makes it possible to reduce the variation in the threshold voltages.

In the foregoing, the invention made by the inventors of this invention has been described in detail based on the embodiments. However, it goes without saying that the present invention is not limited to the above-described embodiments, and various changes and modifications of the invention can be made within the spirit and scope of the invention.

The advantages achieved by the typical ones of the inventions disclosed in this application will be briefly described as follows.

Since a $TiO_2$ film or a $ZrO_2$ film having an amorphous structure deposited by the plasma enhanced chemical vapor deposition method is used as a gate dielectric, a gate dielectric with a good surface smoothness can be obtained. Therefore, simultaneous reductions of both the film thickness of a gate dielectric and the gate leakage current can be achieved. In addition, it is also possible to reduce the variation in the threshold voltages.

What is claimed is:

1. A method of manufacturing a semiconductor device, said semiconductor device comprising: a gate electrode provided via a gate dielectric over a semiconductor substrate having a first conductivity type; and source and drain regions having a second conductivity type isolated from each other and provided in the semiconductor substrate, wherein a process for forming the gate dielectric comprises the step of:

depositing a $TiO_2$ film or a $ZrO_2$ film with an amorphous structure, wherein the gate dielectric maintains the amorphous structure even at a time immediately before the formation of the gate electrode over the gate dielectric.

2. The method of manufacturing a semiconductor device according to claim 1, wherein the gate dielectric maintains the amorphous structure even after all steps of wafer processes.

3. The method of manufacturing a semiconductor device according to claim 2, wherein the process for forming the gate dielectric is performed after a process for forming and electrically activating the source and drain.

4. A method of manufacturing a semiconductor device, said semiconductor device comprising:

a gate electrode provided via a gate dielectric over a semiconductor substrate having a first conductivity type; and source and drain regions having a second conductivity type isolated from each other and provided in the semiconductor substrate, wherein a process for forming the gate dielectric comprises the step of:

depositing a $TiO_2$ film or a $ZrO_2$ film with an amorphous structure, wherein the gate dielectric maintains the amorphous structure even after all steps of wafer processes.

* * * * *